US009130628B1

(12) United States Patent
Mittal et al.

(10) Patent No.: US 9,130,628 B1
(45) Date of Patent: Sep. 8, 2015

(54) DIGITAL PRE-DISTORTER

(71) Applicants: Akshat Mittal, Greater Noida (IN); Arvind Kaushik, Ghaziabad (IN); Peter Z. Rashev, Calgary (CA); Amrit P. Singh, Ludhiana (IN)

(72) Inventors: Akshat Mittal, Greater Noida (IN); Arvind Kaushik, Ghaziabad (IN); Peter Z. Rashev, Calgary (CA); Amrit P. Singh, Ludhiana (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/582,212

(22) Filed: Dec. 24, 2014

(51) Int. Cl.
*H04B 1/62* (2006.01)
*H04B 1/04* (2006.01)
*H04L 27/36* (2006.01)
*H03F 1/32* (2006.01)

(52) U.S. Cl.
CPC ............ *H04B 1/0475* (2013.01); *H03F 1/3247* (2013.01); *H03F 2201/3233* (2013.01); *H04L 27/368* (2013.01)

(58) Field of Classification Search
CPC .......... H03F 1/3247; H03F 2201/3233; H04L 27/368
See application file for complete search history.

(56) References Cited

U.S. PATENT DOCUMENTS

| 5,900,778 | A | 5/1999 | Stonick | |
|---|---|---|---|---|
| 6,587,514 | B1 * | 7/2003 | Wright et al. | 375/296 |
| 7,577,211 | B2 | 8/2009 | Braithwaite | |
| 7,746,957 | B2 | 6/2010 | Ishikawa | |
| 7,783,263 | B2 | 8/2010 | Sperlich | |
| 7,796,960 | B1 | 9/2010 | Rashev | |
| 8,326,239 | B1 | 12/2012 | Peiris | |
| 8,385,391 | B2 | 2/2013 | Balasubramanian | |
| 2003/0058959 | A1 | 3/2003 | Rafie | |
| 2004/0142667 | A1 | 7/2004 | Lochhead | |
| 2012/0128098 | A1 | 5/2012 | Haddad | |
| 2013/0162349 | A1 | 6/2013 | Gao | |
| 2013/0243119 | A1 | 9/2013 | Dalipi | |
| 2014/0009224 | A1 | 1/2014 | Van Zelm | |

FOREIGN PATENT DOCUMENTS

WO      2010136114      12/2010

OTHER PUBLICATIONS

Lei Guan and Anding Zhu, Low-Cost FPGA Implementation of Volterra Series-Based Digital Predistorter for RF Power Amplifiers, IEEE Transactions on Microwave Theory and Techniques, vol. 58, No. 4, Apr. 2010.

* cited by examiner

*Primary Examiner* — Shuwang Liu
*Assistant Examiner* — Ross Varndell
(74) *Attorney, Agent, or Firm* — Charles Bergere

(57) ABSTRACT

A digital pre-distorter (DPD) for an RF transceiver system having multiple antennas includes a DPD controller, first and second address generators, stream select and antenna select muxes, first and second lookup tables (LUTs), first and second dynamic routing logic units, multipliers, an adder, and an accumulator. The DPD controller generates antenna select, stream select and stream routing signals indicative of selection of antennas, the first and second LUTs, and input signals. The DPD controller configures the DPD to share the multipliers and the first and second LUTs between multiple antennas by providing the antenna select signal to the antenna select mux, the stream select signal to the stream select mux, and the stream routing signals to the first and second dynamic routing logic units.

20 Claims, 4 Drawing Sheets

DIGITAL PRE-DISTORTER

BACKGROUND OF THE INVENTION

The present invention generally relates to communication systems, and, more particularly, to a radio frequency (RF) transceiver for a cellular communication system.

Cellular communication systems includes a mobile switching center (MSC), home location registers (HLR), base station controllers (BSC), base transceiver stations (BTS), and user equipment (UE). A BTS facilitates communication between the UEs and an MSC over a cellular network. The BTS includes an RF transceiver for transmitting and receiving RF signals to and from the UEs. Terms such as MSC, BSC, BTS, and UE are technology standard specific, and in this case are used in context of the Global System for Mobile communication (GSM) standard of wireless communication. For instance, the term BTS in the GSM standard corresponds to Node-B in the third generation (3G) and eNode-B in the fourth generation (4G) standards. The RF transceiver modulates a carrier wave by changing one or more characteristics of the carrier wave, viz. amplitude, frequency, and phase, based on an RF signal. The RF transceiver transmits a modulated carrier wave on a transmission medium using an antenna.

FIG. 1 illustrates a conventional RF transceiver system 100 that includes a conventional RF transceiver 102 that is connected to an antenna 104 for transmitting the modulated carrier wave (hereinafter referred to as a "high-power RF signal").

The RF transceiver 102 includes a baseband processing unit 106, an RF integrated circuit (RFIC) 108, and a power amplifier (PA) 110. The baseband processing unit 106 includes a digital signal processor (DSP) 112, a system bus 114, a digital pre-distorter (DPD) 116, a direct memory access system (DMA) 118, a system memory 120, an event control module 122, and an antenna interface 124. The RFIC 108 includes an antenna interface 126, a data converter 128, and an RF mixer 130. The data converter 128 includes a digital-to-analog converter (DAC) 132 and an analog-to-digital converter (ADC) 134.

The DSP 112 performs logical and mathematical operations on digital data such as audio and video data and generates digital samples. The DSP 112 is connected to the DPD 116, the DMA 118, and the system memory 120 via the system bus 114. The event control module 122 is connected to the DSP 112 and generates trigger signals to control the timing of events in the baseband processing unit 106 and the RFIC 108. The DSP 112 controls the event control module 122 by providing control trigger signals to the event control module 122. The DSP 112 generates input signals based on the digital samples and provides the input signals to the DPD 116. The antenna 104 may include multiple antennas. The DSP 112 generates input signals corresponding to the antennas 104.

The DPD 116 receives the input signals and generates pre-distorted output signals by multiplying the input signals with corresponding sets of coefficients from lookup tables (LUTs) (not shown) stored therein. The sets of coefficients are referred to as LUT coefficients. The system memory 120 stores digital data corresponding to the pre-distorted output signals.

The DMA 118 and the DPD 116 are connected to the data converter 128 via the antenna interfaces 124 and 126. The antenna interface 124 receives the pre-distorted output signals from the DPD 116 and transfers the pre-distorted output signals to the antenna interface 126. The DAC 132 receives the pre-distorted output signals from the antenna interface 126 and generates baseband signals. The RF mixer 130 that is connected to the DAC 132 receives the baseband signals and generates analog RF signals.

The PA 110 that is connected to the RF mixer 130 receives the analog RF signals and generates amplified analog RF signals. The PA 110 may include, for example, multiple PAs corresponding to the antennas 104, where a PA amplifies a corresponding analog RF signal and provides the amplified RF signal to the antennas 104.

The RF mixer 130 receives the amplified analog RF signals from the PA 110 as a feedback and generates analog feedback signals. The ADC 134 receives the analog feedback signals and generates digital feedback signals. The DMA system 118 receives digital data corresponding to the digital feedback signals by way of the antenna interfaces 126 and 124, and stores the digital feedback signals in the system memory 120.

The DSP 112 accesses the system memory 120 and compares the digital feedback signals with the pre-distorted output signals. The DSP 112 selects alternate LUT coefficients from the LUT in the DPD 116 based on the comparison of the digital feedback signals with the pre-distorted output signals. In another example, the DSP 112 updates the LUT coefficients of the LUT in the DPD 116 based on the comparison of the digital feedback signals with the pre-distorted output signals.

It is desirable that the PA 110 achieves high efficiency and linearity. For instance, class A PAs are linear PAs but are very expensive and unsuitable for cellular communication systems. Hence, less expensive and non-linear PAs such as class AB, B, and C PAs are widely used.

To maintain linearity of the PAs, digital pre-distortion technique is used. The DPD 116 performs a mathematical inversion of the digital feedback signals received from the PA 110 by way of the ADC 134. The DPD 116 is a non-linear module and the LUT coefficients have inverse characteristic of the digital feedback signals. Thus, the pre-distorted output signals generated by the DPD 116 have an inverse characteristic of the digital feedback signals. When the non-linear PA 110 receives the pre-distorted output signals from the non-linear DPD 116, the PA 110 generates a linear amplified analog RF signal. The aforementioned technique is referred to as digital pre-distortion.

In another example, the DPD 116 uses a dynamic deviation reduction-based Volterra model. The DPD 116 includes a parameter extraction unit (not shown), that receives the digital feedback signal and updates the LUT coefficients based on a Volterra model. The dynamic deviation reduction-based Volterra model is widely used to model the non-linearity of the PAs with memory effects.

FIG. 2 illustrates a schematic block diagram of the DPD 116 of the conventional RF transceiver system 100 of FIG. 1. The DPD 116 is connected to the RFIC 108, and receives the input signals corresponding to the antennas 104 from the DSP 112 and outputs the pre-distorted output signals corresponding to the antennas 104. The DPD 116 includes multiple DPD processing chains corresponding to the antennas 104. A DPD processing chain includes components such as an address generator, a set of LUTs, a set of multipliers, and an adder.

For example, the antennas 104 may include first and second antennas 202a and 202b, so the DPD 116 would include first and second DPD processing chains. The first DPD processing chain includes a first address generator 204a, a first set of LUTs 206a, a first set of multipliers 208a, and a first adder 210a. The first address generator 204a receives a first input signal and generates a first set of addresses.

The first set of LUTs 206a includes multiple LUTs that store multiple LUT coefficients. The first set of LUTs 206a receives the first set of addresses and outputs a first set of LUT coefficients. The first set of multipliers 208a receives the first input signal and the first set of LUT coefficients and generates a first set of pre-distorted digital samples. The first adder 210a receives and accumulates the first set of pre-distorted digital samples and generates a first pre-distorted output signal. The DPD 116 provides the first pre-distorted output signal to the first antenna 202a by way of a first DAC 212a and a first power amplifier 214a.

Similarly, the second DPD processing chain includes a second address generator 204b, a second set of LUTs 206b, a second set of multipliers 208b, and a second adder 210b that are structurally and functionally similar to the first address generator 204a, the first set of LUTs 206a, the first set of multipliers 208a, and the first adder 210a, respectively. The DPD 116 generates and provides a second pre-distorted output signal to the second antenna 202b by way of a second DAC 212b and a second power amplifier 214b.

Thus, for each antenna 104, the DPD 116 includes a set of LUTs and a set of multipliers and hence, for multiple antennas, the DPD 116 includes multiple sets of LUTs and multipliers, thereby increasing the area, complexity and cost of implementation of the DPD 116.

Generally, the RF transceiver 102 is designed to support different types of PAs 110. Each PA 110 has distinct characteristics such as linearity and efficiency. In some cases, the RF transceiver 102 is required to support different antenna configurations and different bandwidths. For instance, the RF transceiver 102 may be required to support a 4×4 multiple-input and multiple-output (MIMO) configuration with a bandwidth of 20 MHz. The RF transceiver 102 may also be required to support a 2×2 MIMO configuration with a bandwidth of 40 MHz. However, the connections between the components of the DPD processing chain within the DPD 116 are fixed, and hence, the conventional DPD 116 cannot be used for the RF transceiver 102 having different configurations. Thus, there is a need for a DPD that has reduced area and complexity and supports different configurations of bandwidth, antenna count, and type of PA.

A known technique to overcome the aforementioned problems is to use high-speed digital hardware circuits such as field-programmable gate arrays (FPGAs) or application-specific integrated circuits (ASICs) to implement the DPD. However, FPGAs and ASICs are expensive and hence, not feasible for low-cost implementation of DPD.

Another known technique to overcome the aforementioned problem uses a common multiplier shared between the set of LUTs for an antenna. The set of LUTs includes coefficients from a truncated Volterra series of the Volterra model and is utilized for an LUT assisted gain indexing. The shared multiplier is time-division multiplexed for sharing between the set of LUTs. Thus, for each antenna, a single shared multiplier is used. However, multiple multipliers are required for RF transceivers catering to multiple antennas. Therefore, the presence of multiple multipliers and LUTs increases the cost and area of an RF transceiver that includes the aforementioned system. Further, the aforementioned system does not cater to different configurations of the RF transceiver, such as varying bandwidth of the antennas and non-linearity of the PAs.

Therefore, it would be advantageous to have a digital pre-distorter (DPD) that supports different configurations of a RF transceiver having different bandwidths, antenna count and power amplifiers, has reduced area and complexity, and reduced implementation cost.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
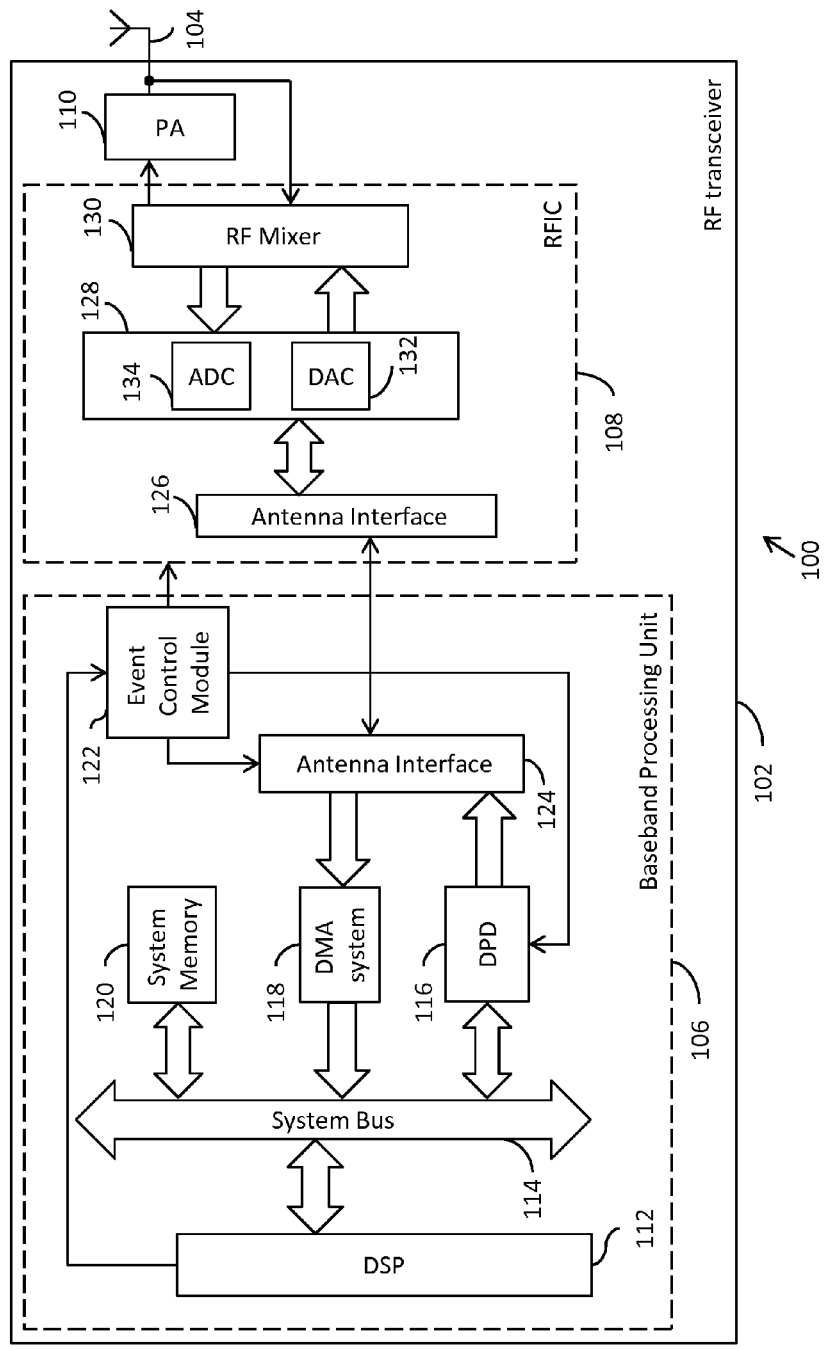
FIG. 1 is a schematic block diagram of a conventional radio-frequency (RF) transceiver system.
Figure 2:
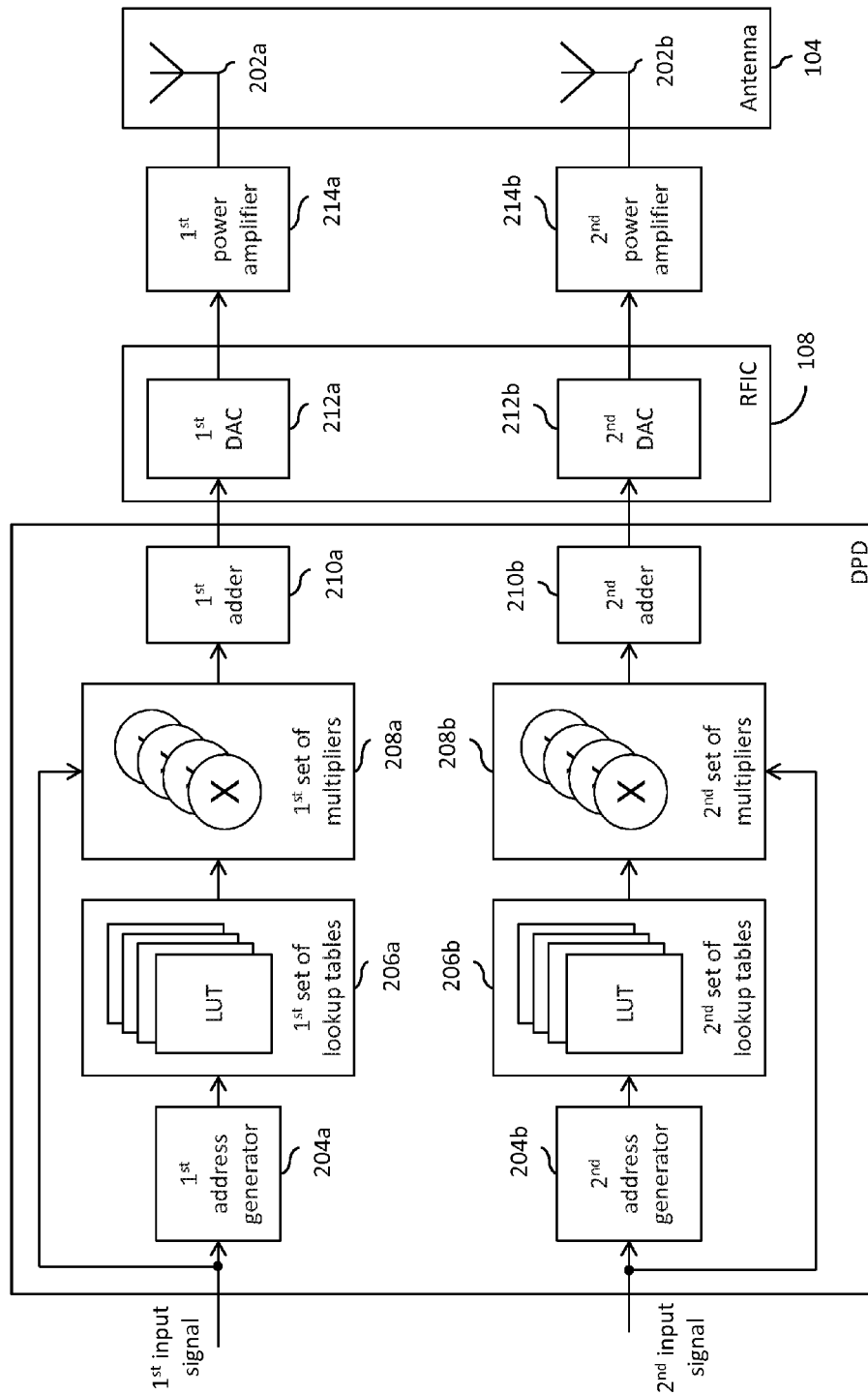
FIG. 2 is a schematic block diagram of a conventional digital pre-distorter (DPD) of the conventional RF transceiver system of FIG. 1.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention. As used herein, the terms mux and multiplexer are used interchangeably.

In an embodiment of the present invention, a digital pre-distorter (DPD) for pre-distorting a plurality of input signals corresponding to a plurality of antennas is provided. The DPD includes a DPD controller, first and second address generators, stream select and antenna select multiplexers, first and second lookup tables, first and second dynamic routing logic units, a plurality of multipliers, an adder, and an accumulator. The DPD controller stores an antenna select value indicative of a count of selected antennas of the plurality of antennas and a stream select value indicative of a selection of the plurality of input signals, and generates an antenna select signal based on the antenna select value and stream select and stream routing signals based on the stream select value. The first address generator receives a first input signal of the plurality of input signals corresponding to a first antenna and generates a first set of addresses. The second address generator receives a second input signal of the plurality of input signals corresponding to a second antenna and generates a second set of addresses. The stream select multiplexer receives the first and second sets of addresses and the stream select signal, and outputs an intermediate set of addresses. The first lookup table corresponds to the first antenna and stores a plurality of coefficients, receives the first set of addresses and outputs a first set of coefficients of the plurality of coefficients. The second lookup table corresponds to the second antenna and stores the plurality of coefficients, receives the intermediate set of addresses and outputs a second set of coefficients of the plurality of coefficients. The first dynamic routing logic unit receives the first and second sets of coefficients and the stream routing signal, and outputs a selected set of coefficients. The antenna select multiplexer receives the first and second input signals and the antenna select signal, and outputs a selected input signal. The plurality of multipliers receive the selected set of coefficients and the selected input signal and generate a plurality of pre-distorted samples. The adder receives and adds the plurality of pre-distorted samples and generates a pre-distorted signal. The accumulator receives the pre-distorted signal and generates an accumulated pre-distorted signal. The second dynamic routing logic unit receives at least one of the pre-distorted and accumulated pre-distorted signals and the stream routing signal, and outputs at least one of first and second pre-distorted output signals corresponding to the first and second antennas, respectively.

In another embodiment of the present invention, a digital front-end (DFE) for generating a plurality of radio-frequency (RF) signals based on corresponding plurality of input signals is provided. The RF signals are transmitted by a corresponding plurality of antennas. The DFE includes a digital pre-distorter (DPD) and a radio-frequency integrated circuit (RFIC). The DPD includes a DPD controller, first and second address generators, stream select and antenna select multiplexers, first and second lookup tables, first and second dynamic routing logic units, a plurality of multipliers, an adder, and an accumulator. The DPD controller stores an antenna select value indicative of a count of selected antennas from the plurality of antennas and a stream select value indicative of a selection of the plurality of input signals, and generates an antenna select signal based on the antenna select value and stream select and stream routing signals based on the stream select value. The first address generator receives a first input signal of the plurality of input signals corresponding to a first antenna and generates a first set of addresses. The second address generator receives a second input signal of the plurality of input signals corresponding to a second antenna and generates a second set of addresses. The stream select multiplexer receives the first and second sets of addresses and the stream select signal, and outputs an intermediate set of addresses. The first lookup table corresponds to the first antenna and stores a plurality of coefficients, receives the first set of addresses and outputs a first set of coefficients of the plurality of coefficients. The second lookup table corresponds to the second antenna and stores the plurality of coefficients, receives the intermediate set of addresses and outputs a second set of coefficients of the plurality of coefficients. The first dynamic routing logic unit receives the first and second sets of coefficients and the stream routing signal, and outputs a selected set of coefficients. The antenna select multiplexer receives the first and second input signals and the antenna select signal, and outputs a selected input signal. The plurality of multipliers receive the selected set of coefficients and the selected input signal and generate a plurality of pre-distorted samples. The adder receives and adds the plurality of pre-distorted samples and generates a pre-distorted signal. The accumulator receives the pre-distorted signal and generates an accumulated pre-distorted signal. The second dynamic routing logic unit receives at least one of the pre-distorted and accumulated pre-distorted signals and the stream routing signal, and outputs at least one of first and second pre-distorted output signals corresponding to the first and second antennas, respectively. The RFIC includes first and second digital-to-analog converters (DACs) and first and second power amplifiers. The first and second DACs receive the first and second pre-distorted output signals and generate first and second analog RF signals, respectively. The first and second power amplifiers receive the first and second analog RF signals, and generate and provide first and second RF signals to the first and second antennas, respectively.

Various embodiments of the present invention provide a digital pre-distorter (DPD) for pre-distorting a plurality of input signals corresponding to a plurality of antennas. The DPD includes a DPD controller, first and second address generators, stream select and antenna select multiplexers, first and second lookup tables (LUTs), first and second dynamic routing logic units, a plurality of multipliers, an adder, and an accumulator. The DPD controller generates an antenna select signal based on an antenna select value indicative of a count of selected antennas of the plurality of antennas and stream select and stream routing signals based on a stream select value indicative of a selection of the plurality of input signals. The first and second address generators generate first and second sets of addresses based on first and second input signals of the plurality of input signals corresponding to first and second antennas, respectively. The stream select multiplexer receives the first and second sets of addresses and the stream select signal, and outputs an intermediate set of addresses.

The first and second LUTs receive the first and second sets of addresses and output first and second sets of coefficients, respectively. The first dynamic routing logic unit receives the first and second sets of coefficients and the stream routing signal, and outputs a selected set of coefficients. The antenna select multiplexer receives the first and second input signals and the antenna select signal, and outputs a selected input signal. The multipliers receive the selected set of coefficients and the selected input signal and generate a plurality of pre-distorted samples. The adder adds the pre-distorted samples and generates a pre-distorted signal. The accumulator receives the pre-distorted signal and generates an accumulated pre-distorted signal. The second dynamic routing logic unit receives at least one of the pre-distorted and accumulated pre-distorted signals and the stream routing signal, and outputs at least one of first and second pre-distorted output signals corresponding to the first and second antennas, respectively.

The DPD enables sharing of the plurality of multipliers between the first and second antennas. The DPD enables utilization of the first and second LUTs for one of the first and second antennas, thereby increasing the bandwidth. Based on the number of coefficients used from the LUTs, the DPD enables compensation of power amplifiers having different linearity. Thus, the DPD enables sharing of the multipliers between the antennas, enables utilization of the LUTs based on the count of antennas, and hence, reduces the area, hardware complexity and cost of implementation of the DPD and enables support of different configurations of an RF transceiver having different bandwidth, antenna count and power amplifiers.

Figure 3:
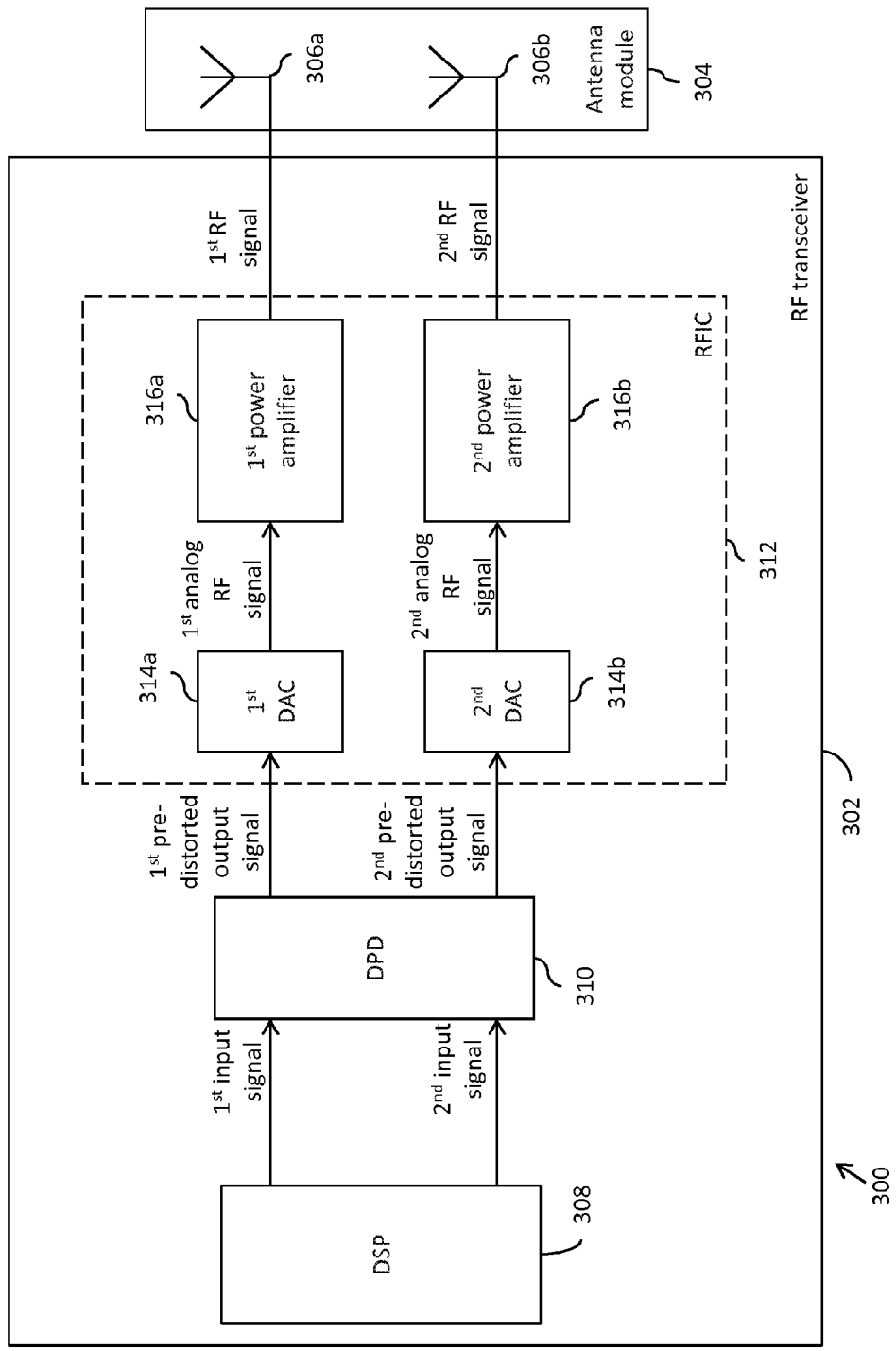
FIG. 3 is a schematic block diagram of a radio-frequency (RF) transceiver system in accordance with an embodiment of the present invention.

Referring now to FIG. 3, a schematic block diagram of a radio-frequency (RF) transceiver system 300 in accordance with an embodiment of the present invention is shown. The RF transceiver system 300 includes an RF transceiver 302 that is connected to an antenna module 304 for transmitting RF signals.

The antenna module 304 includes multiple antennas. For instance, the antenna module 304 includes T antennas, wherein T is an integer and denotes a count of antennas of the antenna module 304. The T antennas enable provision of different types of multiple-input and multiple-output (MIMO) configurations for the RF transceiver 302. For instance, if T=4, the antenna module 304 includes 4 antennas. The RF transceiver 302 configures the number of active antennas for transmission and hence, enables the RF transceiver 302 to have 4×4 MIMO or 2×2 MIMO configurations. Further, each antenna of the antenna module 304 supports a bandwidth of BW MHz, and the RF transceiver 302 configures the RF transceiver system 300 to operate at different bandwidth configurations. In an example, T=2, and hence, the antenna module 304 includes first and second antennas 306$a$ and 306$b$. Based on the configuration of active antennas, the RF transceiver 302 can utilize at least one of the first and second antennas 306$a$ and 306$b$ for transmission of the RF signals.

The RF transceiver 302 includes a digital signal processor (DSP) 308, a digital pre-distorter (DPD) 310, and a radio-frequency integrated circuit (RFIC) 312. The RF transceiver 302 generates and provides the RF signals corresponding to the number of antennas in the antenna module 304. Thus, in the example, if the antenna module 304 has 2 antennas, i.e., the first and second antennas 306a and 306b, the RF transceiver 302 provides first and second RF signals to the antenna module 304.

The DSP 308 performs logical and mathematical operations on digital data such as audio and video data received from Layer 2 or Layer 3 processor and generates digital samples. The DSP 308 generates input signals based on the digital samples corresponding to the T antennas of the antenna module 304 and provides the input signals to the DPD 310. Thus, if T antennas of the antenna module 304 are active, the DSP 308 generates T input signals corresponding to the T active antennas. In the example, the DSP 308 generates first and second input signals corresponding to the first and second antennas 306a and 306b.

The DPD 310 is connected to the DSP 308 for receiving the input signals and generating pre-distorted output signals by multiplying the input signals with corresponding sets of coefficients from look-up-tables (LUTs) (not shown) stored therein. The sets of coefficients are referred to as LUT coefficients. In the example, the DPD 310 receives the first and second input signals and generates first and second pre-distorted output signals.

The RFIC 312 is connected between the DPD 310 and the antenna module 304. The RFIC 312 includes multiple RF signal processing chains corresponding to the T antennas of the antenna module 304. Each chain includes a digital-to-analog converter (DAC) and a power amplifier (PA). Thus, the RFIC 312 includes T RF signal processing chains, and hence T DACs and T PAs. The DACs receive the pre-distorted output signals and generate analog RF signals. The PAs receive the analog RF signals, amplify the analog RF signals, and generate and provide the RF signals to the antenna module 304. In the example, the RFIC 312 includes 2 RF signal processing chains. The RFIC 312 includes first and second DACs 314a and 314b connected to the DPD 310 for receiving first and second pre-distorted output signals and generating first and second analog RF signals. The RFIC 312 includes first and second PAs 316a and 316b connected to the first and second DACs 314a and 314b for receiving the first and second analog RF signals and generating first and second RF signals, respectively. The RFIC 312 transmits the first and second RF signals by way of the first and second antennas 306a and 306b.

Figure 4:
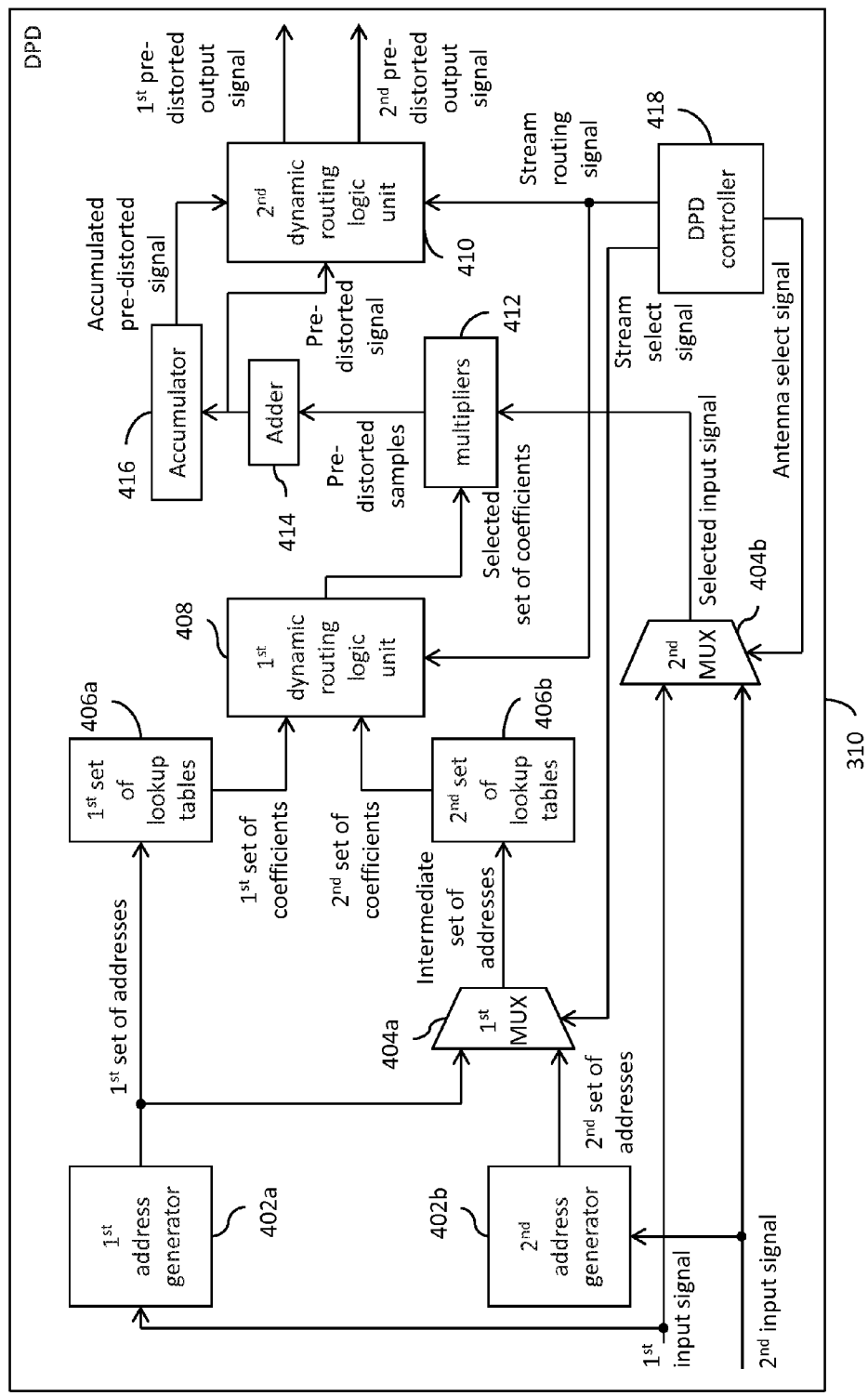
FIG. 4 is a schematic block diagram of a digital pre-distorter (DPD) of the RF transceiver system of FIG. 3 in accordance with an embodiment of the present invention.

Referring now to FIG. 4, a schematic block diagram of a digital pre-distorter (DPD) 310 of the RF transceiver system 300 of FIG. 3 in accordance with an embodiment of the present invention is shown. The DPD 310 receives the first and second input signals and generates the first and second pre-distorted output signals corresponding to the first and second antennas 306a and 306b. The first and second input signals include in-phase and quadrature-phase (I/Q) digital data. The DPD 310 includes first and second address generators 402a and 402b, first and second muxes 404a and 404b, first and second sets of lookup tables (LUTs) 406a and 406b, first and second dynamic routing logic units 408 and 410, a plurality of multipliers 412, an adder 414, an accumulator 416, and a DPD controller 418. The aforementioned components of the DPD 310 are operable at one of the first and second sampling rates. In an example, the first and second sampling rates are S and 2S mega samples per second (MSPS), respectively.

The first address generator 402a receives the first input signal and generates a first set of addresses. The first address generator 402a corresponds to the first antenna 306a. The first address generator 402a calculates the magnitude of the first input signal and generates the first set of addresses based on the magnitude of the first input signal. In an embodiment of the present invention, the first address generator 402a is a microcontroller.

The second address generator 402b receives the second input signal and generates a second set of addresses. The second address generator 402b corresponds to the second antenna 306b. The second address generator 402b calculates the magnitude of the second input signal and generates the second set of addresses based on the magnitude of the second input signal. In an embodiment of the present invention, the second address generator 402b is a microcontroller.

The first mux 404a (hereinafter referred to as "stream select mux") is used to select a set of addresses corresponding to one of the first and second input signals. The stream select mux 404a has a first input terminal connected to the first address generator 402a for receiving the first set of addresses, a second input terminal connected to the second address generator 402b for receiving the second set of addresses, and a select terminal connected to the DPD controller 418 for receiving the stream select signal, and an output terminal for outputting an intermediate set of addresses based on the stream select signal.

The first set of LUTs 406a corresponds to the first antenna 306a. The first set of LUTs 406a includes multiple LUTs (hereinafter referred to as "LUTs 406a"). In an example, the LUTs 406a include N LUTs, wherein N indicates a count of the LUTs. Each LUT 406a stores multiple coefficients of a non-linear Volterra function of the Volterra model. In an example, the Volterra model is a truncated Volterra DPD model. The coefficients of the non-linear Volterra function are stored in the LUT 406a based on normalized magnitudes of the first and second input signals generated by the DSP 308. In an example, the LUTs 406a are mapped on a standalone random-access memory (RAM, not shown) and the LUTs 406a are indexed using the magnitude of the input signals. In another example, each LUT 406a includes two parts—first and second parts for storing real and imaginary parts of the coefficients of the non-linear Volterra function. The LUTs 406a are connected to the first address generator 402a for receiving the first set of addresses and outputting a first set of coefficients. Based on the non-linearity of the first and second PAs 316a and 316b and the first set of addresses, the LUTs 406a can be configured to output more number of coefficients as the first set of coefficients.

The second set of LUTs 406b corresponds to the second antenna 306b. The second set of LUTs 406b includes multiple LUTs (hereinafter referred to as "LUTs 406b"). The LUTs 406b are structurally and functionally similar to the LUTs 406a. The LUTs 406b are connected to the output terminal of the stream select mux 404a for receiving the intermediate set of addresses and outputting a second set of coefficients.

The first dynamic routing logic unit 408 is connected to the LUTs 406a and 406b for receiving the first and second sets of coefficients, respectively, and to the DPD controller 418 for receiving a stream routing signal, and outputting a selected set of coefficients. In an embodiment of the present invention, the first dynamic routing logic unit 408 is a switching fabric and operates as a multiplexing unit. The stream routing signal acts as a select signal for the first dynamic routing logic unit 408. Based on the stream routing signal, the first dynamic routing logic unit 408 outputs the selected set of coefficients that includes at least one of the first and second sets of coefficients.

The second mux 404b (hereinafter referred to as "antenna select mux") is utilized to select one of the first and second input signals as a selected input signal. The antenna select mux 404b has a first input terminal for receiving the first input signal, a second input terminal for receiving the second input signal, a select input terminal connected to the DPD controller 418 for receiving an antenna select signal, and an output terminal for outputting at least one of the first and second input signals as a selected input signal.

The plurality of multipliers 412 (hereinafter referred to as "multipliers 412") are a set of multipliers that are shared between the first and second PAs 316a and 316b, and hence, shared between the first and second antennas 306a and 306b. The multipliers 412 are configured to operate at the second sampling rate, i.e., 2S MSPS. The multipliers 412 are connected to the first dynamic routing logic unit 408 and the antenna select mux 404b for receiving the selected set of coefficients and the selected input signal, respectively. The multipliers 412 multiply the selected set of coefficients with the selected input signal to generate a plurality of pre-distorted samples.

The adder 414 is connected to the multipliers 412 for receiving the pre-distorted samples. The adder 414 adds the pre-distorted samples and generates a pre-distorted signal. When the DPD 310 is configured to utilize the LUTs 406a and 406b (2N LUTs from the LUTs 406a and 406b for one antenna) for one of the first and second antennas 306a and 306b, the adder 414 is configured to output the pre-distorted signal to the accumulator 416. When the DPD 310 is configured to utilize the LUTs 406a and 406b for the first and second antennas 306a and 306b, respectively, the accumulator 416 is disabled and the adder 414 is configured to output the pre-distorted signal to the second dynamic routing logic unit 410. In an embodiment of the present invention, the adder 414 is implemented using a microcontroller.

The accumulator 416 is connected to the adder 414 for receiving the pre-distorted signal and generating an accumulated pre-distorted signal. In an example, the accumulator 416 receives the pre-distorted signal generated at the second sampling rate, i.e., at 2S MSPS and accumulates the pre-distorted signal to generate the accumulated pre-distorted signal at the first sampling rate, i.e., at S MSPS. In an embodiment of the present invention, the accumulator 416 is implemented using a microcontroller.

The second dynamic routing logic unit 410 is connected to the adder 414 and the accumulator 416 for receiving the pre-distorted and accumulated pre-distorted signals, respectively, and to the DPD controller 418 for receiving the stream routing signal. In an embodiment of the present invention, the second dynamic routing logic unit 410 is a switching fabric and operates as a de-multiplexing unit. The stream routing signal acts as a select signal for the second dynamic routing logic unit 410. Based on the stream routing signal, the second dynamic routing logic unit 410 outputs at least one of the pre-distorted and accumulated pre-distorted signals as at least one of first and second pre-distorted output signals corresponding to the first and second antennas 306a and 306b.

When the DPD 310 is configured to use the LUTs 406a and 406b (2N LUTs from the LUTs 406a and 406b for one antenna) for one of the first and second antennas 306a and 306b, the second dynamic routing logic unit 410 outputs the accumulated pre-distorted signal as one of the first and second pre-distorted output signals based on the stream routing signal. When the DPD 310 is configured to utilize the LUTs 406a and 406b for the first and second antennas 306a and 306b, respectively, the second dynamic routing logic unit 410 outputs the pre-distorted signal as at least one of the first and second pre-distorted output signals based on the stream routing signal.

The DPD controller 418 is connected to the stream select mux 404a, the antenna select mux 404b, and the first and second dynamic routing logic units 408 and 410. The DPD controller 418 includes an internal memory (not shown) for storing an antenna select value indicative of a count of selected antennas of the T antennas included in the antenna module 304 and a stream select value indicative of a selection of the input signals based on the active antennas. For instance, the antenna select value may indicate that the first antenna 306a is selected. In another example, the stream select value may indicate that the first input signal is selected for pre-distortion and transmission by way of the first antenna 306a. In an embodiment of the present invention, the DPD controller 418 is a state machine implemented using a microcontroller.

The DPD controller 418 generates the antenna select signal based on the antenna select value and the stream select and stream routing signals based on the stream select value. The stream select signal is a static signal. A logic low stream select signal is indicative of a selection of the first input signal. A logic high stream select signal is indicative of a selection of the second input signal. The stream routing signal is at least one of dynamic and static signals. Logic low and logic high stream routing signals are indicative of selection of the first and second sets of lookup tables, respectively. Similarly, the antenna select signal is at least one of the dynamic and static signals. Logic low and logic high antenna select signals are indicative of selection of the first antenna 306a for transmission of the first RF signal generated based on the first pre-distorted output signal and the second antenna 306b for transmission of the second RF signal generated based on the second pre-distorted output signal, respectively. In an example, when the stream routing and antenna select signals are dynamic, the DPD controller 418 toggles the stream routing and antenna select signals between the logic high and logic low states at the second sampling rate, i.e., at 2S MSPS.

The DPD controller 418 enables activation of different configurations of the DPD 310 based on the number of active antennas of the antenna module 304. For instance, the antenna module 304 includes 2 antennas—the first and second antennas 306a and 306b. The DPD controller 418 can configure the DPD 310 for at least one antenna having bandwidth of BW MHz or for a single antenna having bandwidth of 2BW MHz.

To configure the DPD 310 for at least one antenna with bandwidth of BW MHz, the DPD controller 418 configures the DPD 310 to operate at the first sampling rate, i.e., S MSPS and generates the stream select signal at logic high state indicative of the selection of the second input signal. The DPD controller 418 further toggles the stream routing signal between logic low and logic high states and toggles the antenna select signal between logic low and logic high states, and hence, the stream routing and antenna select signals are dynamic. Thus, the stream select mux 404a receives the logic high stream select signal and outputs the second set of addresses as the intermediate set of addresses. The first dynamic routing logic unit 408 receives the dynamic stream routing signal and outputs the first and second sets of coefficients as the selected set of coefficients. Thus, the selected set of coefficients includes the first and second sets of coefficients. The antenna select mux 404b receives the dynamic antenna select signal and outputs the first and second input signals as the selected input signal. Thus, the selected input signal toggles between the first and second input signals based on the antenna select signal. The DPD controller 418 configures the multipliers 412 to operate at the second sampling rate, i.e., 2S MSPS. The multipliers 412 multiply the first set of coefficients with the first input signal and the second set of coefficients with the second input signal to generate the pre-distorted samples. The adder 414 adds the pre-distorted samples to generate the pre-distorted signal. The accumulator 416 is disabled. The second dynamic routing logic unit 410 receives the pre-distorted signal, routes the pre-distorted signal based on the dynamic stream routing signal, and outputs the first pre-distorted output signal to the first antenna 306a by way of the first DAC 314a and the first PA 316a and the second pre-distorted output signal to the second antenna 306b by way of the second DAC 314b and the second PA 316b. Thus, the DPD 310 utilizes N LUTs for the first and second antennas 306a and 306b, thereby enabling a bandwidth of BW MHz.

The DPD controller 418 enables configuration of the DPD 310 for a single antenna having bandwidth of 2BW MHz. In an example, the DPD 310 configures the first antenna 306a as the active antenna.

In an embodiment of the present invention, to configure the DPD 310 for the first antenna 306a having bandwidth of 2BW MHz, the DPD controller 418 configures the DPD 310 to operate at the second sampling rate, i.e., 2S MSPS and generates the stream select signal at logic low state indicative of the selection of the first input signal. However, the DPD controller 418 deactivates the stream select mux 404a. Thus, the first dynamic routing logic unit 408 receives and outputs the first set of coefficients as the selected set of coefficients. The DPD controller 418 further generates a static antenna select signal at logic low state indicative of selection of the first antenna 306a for transmission and a static stream routing signal at logic low state for selection of the LUTs 406a, and hence selecting N LUTs from the LUTs 406a for the first antenna 306a. The antenna select mux 404b outputs the first input signal as the selected input signal. The DPD controller 418 configures the multipliers 412 to operate at the second sampling rate, i.e., 2S MSPS. The multipliers 412 multiply the first set of coefficients with the first input signal to generate the pre-distorted samples. The adder 414 adds the pre-distorted samples to generate the pre-distorted signal. The accumulator 416 is disabled. The second dynamic routing logic unit 410 receives the pre-distorted signal, routes the pre-distorted signal based on the dynamic stream routing signal and outputs the first pre-distorted output signal to the first antenna 306a by way of the first DAC 314a and the first PA 316a. Thus, the DPD 310 utilizes N LUTs for the first antenna 306a. However, since the multipliers 412 operate at 2S MSPS, the DPD controller 418 enables a bandwidth of 2BW MHz for the first antenna 306a.

In another embodiment of the present invention, to configure the DPD 310 for the first antenna 306a having bandwidth of 2BW MHz, the DPD controller 418 configures the DPD 310 to operate at the first sampling rate, i.e., S MSPS, and generates the stream select signal at logic low state indicative of the selection of the first input signal. Thus, the stream select mux 404a outputs the first set of addresses as the intermediate set of addresses. Thus, the first dynamic routing logic unit 408 receives and outputs the first and second sets of coefficients as the selected set of coefficients. The DPD controller 418 further generates a static antenna select signal at logic low state indicative of selection of the first antenna 306a for transmission and the dynamic stream routing signal that toggles between the logic low and logic high states for selection of the LUTs 406a and 406b, and hence selecting 2N LUTs from the LUTs 406a and 406b. Thus, the antenna select mux 404b outputs the first input signal as the selected input signal. The DPD controller 418 configures the multipliers to operate at the second sampling rate, i.e., 2S MSPS. The multipliers 412 multiply the first and second sets of coefficients with the first input signal to generate the pre-distorted samples. The adder 414 adds the pre-distorted samples to generate the pre-distorted signal. The accumulator 416 is enabled and accumulates the pre-distorted signal generated at 2S MSPS to generate the accumulated pre-distorted signal. The second dynamic routing logic unit 410 receives the accumulated pre-distorted signal, routes the accumulated pre-distorted signal based on the dynamic stream routing signal, and outputs the first pre-distorted output signal to the first antenna 306a by way of the first DAC 314a and the first PA 316a. Since the multipliers 412 operate at 2S MSPS and the DPD 310 utilizes 2N LUTs for the first antenna 306a, the DPD controller 418 enables a bandwidth of 2BW MHz for the first antenna 306a.

Thus, the DPD 310 is a flexible DPD that supports different bandwidth configurations (BW or 2BW MHz) and multiple antenna configurations (one or two antennas). Further, the DPD 310 enables compensation for different types of PAs by utilization of variable LUTs and variable sampling rates for the components of the DPD 310. For instance, if the non-linearity of the PA is high, the DPD 310 enables utilization of more than N LUTs, i.e., 2N LUTs, for a single antenna. Further, the DPD 310 utilizes a common set of multipliers 412 and LUTs between multiple antennas of the antenna module 304, and hence, reduces area, complexity, and cost for implementing the DPD 310.

Further, the DPD 310 is scalable to T antennas. For each antenna, the DPD 310 will include N LUTs. Thus, the DPD 310 can operate at S MSPS sampling rate and support T antennas having bandwidth BW MHz with N LUTs for each antenna. If M is an integer and a factor of T, the DPD 310 can operate at M*S MSPS sampling rate to support T/M antennas having bandwidth M*BW MHz with N LUTs for each antenna. Furthermore, the DPD 310 can operate at S MSPS sampling rate to support T/M antennas having bandwidth M*BW MHz with M*N LUTs for each antenna. In an example, if T=3, the DPD 310 enables 3 antennas to share the multipliers 412 and the LUTs for bandwidth BW MHz and enables each antenna to share the multipliers 412 and utilize 3N LUTs for bandwidth of 3BW MHz.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A digital pre-distorter (DPD) for pre-distorting a plurality of input signals corresponding to a plurality of antennas, comprising:
 a DPD controller for storing (i) an antenna select value indicative of a count of selected antennas of the plurality of antennas, and (ii) a stream select value indicative of a selection of the plurality of input signals, and generating an antenna select signal based on the antenna select value, and stream select and stream routing signals based on the stream select value;
 a first address generator for receiving a first input signal of the plurality of input signals corresponding to a first antenna, and generating a first set of addresses;

a second address generator for receiving a second input signal of the plurality of input signals corresponding to a second antenna, and generating a second set of addresses;

a stream select multiplexer having (i) first and second input terminals connected to the first and second address generators for receiving the first and second sets of addresses, respectively, (ii) a select terminal connected to the DPD controller for receiving the stream select signal, and (iii) an output terminal for outputting an intermediate set of addresses;

a first set of lookup tables corresponding to the first antenna for storing a plurality of coefficients, wherein the first set of lookup tables is connected to the first address generator for receiving the first set of addresses, and outputting a first set of coefficients of the plurality of coefficients;

a second set of lookup tables corresponding to the second antenna for storing the plurality of coefficients, wherein the second set of lookup tables is connected to the output terminal of the stream select multiplexer for receiving the intermediate set of addresses, and outputting a second set of coefficients of the plurality of coefficients;

a first dynamic routing logic unit connected to the first and second sets of lookup tables for receiving the first and second sets of coefficients, respectively, and to the DPD controller for receiving the stream routing signal, and outputting a selected set of coefficients;

an antenna select multiplexer having (i) first and second input terminals for receiving the first and second input signals, respectively, (ii) a select terminal connected to the DPD controller for receiving the antenna select signal, and (iii) an output terminal for outputting a selected input signal;

a plurality of multipliers, connected to the first dynamic routing logic unit and the antenna select multiplexer, for receiving the selected set of coefficients and the selected input signal, respectively, and generating a plurality of pre-distorted samples;

an adder connected to the plurality of multipliers for receiving and adding the plurality of pre-distorted samples and generating a pre-distorted signal;

an accumulator connected to the adder for receiving the pre-distorted signal and generating an accumulated pre-distorted signal; and a second dynamic routing logic unit, connected to the adder, the accumulator and the DPD controller, for receiving at least one of the pre-distorted and accumulated pre-distorted signals and the stream routing signal, and outputting at least one of first and second pre-distorted output signals corresponding to the first and second antennas, respectively.

2. The DPD of claim 1, wherein the DPD controller, the first and second address generators, the first and second sets of lookup tables, the first and second dynamic routing logic units, and the stream and antenna select multiplexers operate at a first sampling rate, and the plurality of multipliers operate at a second sampling rate.

3. The DPD of claim 2, wherein the DPD controller generates the stream select signal at a first logic state indicative of the selection of the second input signal, toggles the stream routing signal between logic low and logic high states indicative of selection of the first and second sets of lookup tables, respectively, and toggles the antenna select signal between logic low and logic high states indicative of selection of the first antenna for transmission of a first radio-frequency (RF) signal generated based on the first pre-distorted output signal and the second antenna for transmission of a second RF signal generated based on the second pre-distorted output signal, respectively, and wherein the DPD controller toggles the stream routing and antenna select signals at the second sampling rate.

4. The DPD of claim 3, wherein the plurality of multipliers receive the selected input signal indicative of the first and second input signals sampled at the second sampling rate and the selected set of coefficients that includes the first and second sets of coefficients, and multiplies the first and second sets of coefficients with the first and second input signals, respectively, wherein the DPD uses the plurality of multipliers for generating the plurality of pre-distorted samples for the first and second antennas.

5. The DPD of claim 4, wherein the second dynamic routing logic unit outputs the pre-distorted signal as the first and second pre-distorted output signals corresponding to the first and second antennas, respectively, based on the stream select signal.

6. The DPD of claim 2, wherein the DPD controller generates the stream select signal at a logic low state indicative of the selection of the first input signal, toggles the stream routing signal between logic low and logic high states at the second sampling rate indicative of selection of the first and second sets of lookup tables, respectively, and generates the antenna select signal at a logic low state indicative of selection of the first antenna for transmission of a first radio-frequency (RF) signal generated based on the first pre-distorted output signal.

7. The DPD of claim 6, wherein:
the plurality of multipliers receive the selected input signal indicative of the first input signal sampled at the first sampling rate and the selected set of coefficients that includes the first and second sets of coefficients, and multiplies the selected set of coefficients with the first input signal, and
wherein the DPD uses the plurality of multipliers for generating the plurality of pre-distorted samples based on the first and second sets of coefficients for the first antenna.

8. The DPD of claim 7, wherein the accumulator generates the accumulated pre-distorted signal that includes the plurality of pre-distorted samples generated based on the first and second sets of coefficients and the first input signal.

9. The DPD of claim 8, wherein the second dynamic routing logic unit outputs the accumulated pre-distorted signal as the first pre-distorted output signal corresponding to the first antenna based on the logic low stream select signal.

10. The DPD of claim 1, wherein the first and second dynamic routing logic units include multiplexing and de-multiplexing units.

11. A radio-frequency (RF) transceiver for generating a plurality of RF signals based on a corresponding plurality of input signals, wherein the RF signals are transmitted by way of a corresponding plurality of antennas, the RF transceiver comprising:
a digital pre-distorter (DPD) for pre-distorting the plurality of input signals, the DPD comprising:
a DPD controller for (i) storing an antenna select value indicative of a count of selected antennas of the plurality of antennas and a stream select value indicative of a selection of the plurality of input signals, (ii) generating an antenna select signal based on the antenna select value and stream select and (iii) stream routing signals based on the stream select value;
a first address generator for receiving a first input signal of the plurality of input signals corresponding to a first antenna and generating a first set of addresses;

a second address generator for receiving a second input signal of the plurality of input signals corresponding to a second antenna and generating a second set of addresses;

a stream select multiplexer having (i) first and second input terminals connected to the first and second address generators for receiving the first and second sets of addresses, respectively, (ii) a select terminal connected to the DPD controller for receiving the stream select signal, and (iii) an output terminal for outputting an intermediate set of addresses;

a first set of lookup tables corresponding to the first antenna for storing a plurality of coefficients, wherein the first set of lookup tables is connected to the first address generator for receiving the first set of addresses and outputting a first set of coefficients of the plurality of coefficients;

a second set of lookup tables corresponding to the second antenna for storing the plurality of coefficients, wherein the second set of lookup tables is connected to the output terminal of the stream select multiplexer for receiving the intermediate set of addresses and outputting a second set of coefficients of the plurality of coefficients;

a first dynamic routing logic unit connected to the first and second sets of lookup tables for receiving the first and second sets of coefficients, respectively, and to the DPD controller for receiving the stream routing signal and outputting a selected set of coefficients;

an antenna select multiplexer having (i) first and second input terminals for receiving the first and second input signals, respectively, (ii) a select terminal connected to the DPD controller for receiving the antenna select signal, and (iii) an output terminal for outputting a selected input signal;

a plurality of multipliers, connected to the first dynamic routing logic unit and the antenna select multiplexer, for receiving the selected set of coefficients and the selected input signal, respectively, and generating a plurality of pre-distorted samples;

an adder, connected to the plurality of multipliers, for receiving and adding the plurality of pre-distorted samples and generating a pre-distorted signal;

an accumulator connected to the adder for receiving the pre-distorted signal and generating an accumulated pre-distorted signal; and a second dynamic routing logic unit connected to the adder, the accumulator and the DPD controller, for receiving at least one of the pre-distorted and accumulated pre-distorted signals and the stream routing signal, and outputting at least one of first and second pre-distorted output signals corresponding to the first and second antennas, respectively; and a radio-frequency integrated circuit (RFIC) that receives at least one of the first and second pre-distorted output signals and generates first and second RF signals, the RFIC comprising:

a first digital-to-analog converter (DAC) connected to the second dynamic routing logic unit for receiving the first pre-distorted output signal and generating a first analog RF signal;

a second DAC connected to the second dynamic routing logic unit for receiving the second pre-distorted output signal and generating a second analog RF signal;

a first power amplifier connected to the first DAC for receiving the first analog RF signal, and generating and providing the first RF signal to the first antenna; and a second power amplifier connected to the second DAC for receiving the second analog RF signal, and generating and providing the second RF signal to the second antenna.

12. The RF transceiver of claim 11, wherein the DPD controller, the first and second address generators, the first and second sets of lookup tables, the first and second dynamic routing logic units, and the stream and antenna select multiplexers operate at a first sampling rate and the plurality of multipliers operate at a second sampling rate.

13. The RF transceiver of claim 12, wherein the DPD controller generates the stream select signal at a logic high state indicative of the selection of the second input signal, toggles the stream routing signal to select one of the first and second sets of lookup tables, respectively, and toggles the antenna select signal to select the first antenna for transmission of the first RF signal and the second antenna for transmission of the second RF signal, respectively, and wherein the DPD controller toggles the stream routing and antenna select signals at the second sampling rate.

14. The RF transceiver of claim 13, wherein the multipliers receive the selected input signal indicative of the first and second input signals sampled at the second sampling rate and the selected set of coefficients that includes the first and second sets of coefficients, and multiplies the first and second sets of coefficients with the first and second input signals, respectively, wherein the DPD uses the multipliers for generating the plurality of pre-distorted samples for the first and second antennas.

15. The RF transceiver of claim 14, wherein the second dynamic routing logic unit outputs the pre-distorted signal as the first and second pre-distorted output signals corresponding to the first and second antennas, respectively, based on the stream select signal.

16. The RF transceiver of claim 12, wherein the DPD controller generates the stream select signal at a logic low state indicative of the selection of the first input signal, toggles the stream routing signal between logic low and logic high states at the second sampling rate indicative of selection of the first and second sets of lookup tables, respectively, and generates the antenna select signal at a logic low state indicative of selection of the first antenna for transmission of the first RF signal.

17. The RF transceiver of claim 16, wherein the multipliers receive the selected input signal indicative of the first input signal sampled at the first sampling rate and the selected set of coefficients that includes the first and second sets of coefficients, and multiply the selected set of coefficients with the first input signal, and wherein the DPD uses the multipliers for generating the plurality of pre-distorted samples based on the first and second sets of coefficients for the first antenna.

18. The RF transceiver of claim 17, wherein the accumulator generates the accumulated pre-distorted signal that includes the plurality of pre-distorted samples generated based on the first and second sets of coefficients and the first input signal.

19. The RF transceiver of claim 18, wherein the second dynamic routing logic unit outputs the accumulated pre-distorted signal as the first pre-distorted output signal corresponding to the first antenna based on the logic low stream select signal.

20. The RF transceiver of claim 11, wherein the first and second dynamic routing logic units include multiplexing and de-multiplexing units.

\* \* \* \* \*